United States Patent [19]
Keller

[11] Patent Number: 4,797,525
[45] Date of Patent: Jan. 10, 1989

[54] INDUCTION HEATER FOR FLOATING ZONE MELTING

[75] Inventor: Wolfgang Keller, Munich, Fed. Rep. of Germany

[73] Assignee: Siemens Aktiengesellschaft, Berlin and Munich, Fed. Rep. of Germany

[21] Appl. No.: 76,254

[22] Filed: Jul. 21, 1987

[30] Foreign Application Priority Data

Jul. 29, 1986 [DE] Fed. Rep. of Germany ....... 3625669

[51] Int. Cl.⁴ .............................................. H05B 6/40
[52] U.S. Cl. ................................ 219/10.79; 219/10.43; 219/10.71; 373/139
[58] Field of Search ...................... 219/10.43, 10.49 R, 219/10.75, 10.79, 10.71, 10.67; 373/139

[56] References Cited

U.S. PATENT DOCUMENTS

| | | | |
|---|---|---|---|
| 3,472,992 | 10/1969 | Geisel | 219/10.79 |
| 3,886,509 | 5/1975 | Keller | 219/10.79 X |
| 3,935,059 | 1/1976 | Ayel | 373/139 X |
| 4,506,132 | 3/1985 | Keller | 219/10.49 R X |
| 4,538,279 | 8/1985 | Keller | 373/139 |

FOREIGN PATENT DOCUMENTS 1802524 6/1970 Fed. Rep. of Germany.
2538854 2/1979 Fed. Rep. of Germany.

*Primary Examiner*—Philip H. Leung
*Attorney, Agent, or Firm*—John Francis Moran

[57] ABSTRACT

When semiconductor rods during floating zone melting are doped with dopants having a very low distribution coefficient, the non-homogeneous temperature distribution causes a relatively strong non-homogeneous separation of the dopants (striation). The homogeneity can be improved through an after-heater (6) connected to the heating coil (4) and arranged on the side of the monocrystalline rod part (2), the heater being coaxial with the coil and connected parallel to it.

4 Claims, 1 Drawing Sheet

INDUCTION HEATER FOR FLOATING ZONE MELTING

BACKGROUND OF THE INVENTION

This invention relates to an induction heater for floating zone melting of a crystalline semiconductor rod, and it relates, more particularly, to an induction heater comprising a flat coil and a cylindrical supplementary heater of a material having good electrical conductivity connected parallel with the flat coil.

An induction heater of the mentioned kind is described, for 10 example, in German patent document DE-AS No. 18 02 524. The supplementary heater consists of a cylinder, in which the flat coil is arranged in such a way that the cylinder projects on both sides beyond the flat coil, for example, equally. The part of the cylinder facing the polycrystalline supply rod serves as pre-heater and the part of the cylinder facing the monocrystalline semiconductor rod as an afterheater. The purpose of the supplementary heater was thought to lie in maintaining the temperature gradient on both sides of the melting zone in the adjacent solid rod parts of the semiconductor rod low.

Experiments with the described induction heater, however, have shown that the pre-heater produces unfavorable results. In the presence of the pre-heater, melting of the supply rods with respect to a simple flat coil takes place earlier. Depending on the quality of the polycrystalline silicon in this configuration, non-melting lugs directed axially form especially at the edge of the rod which are not melted by the flat coil. The drawing process, therefore, must be interrupted at this point, which renders the entire rod useless.

SUMMARY OF THE INVENTION

The present invention is based on the task of developing an improved induction heater of the mentioned kind in such a way, that on the one hand, the known drawbacks do not occur and, on the other hand, achieves good homogeneous temperature distribution.

It is generally known that with increasingly non-homogeneous temperature distribution the fluctuations over time of the growth rate of the monocrystal increase. With it the effective distribution coefficient $k_{eff}$ and thus doping in the microscopic range changes also. These doping changes are described as "straitions". In the process, the effect of the fluctuations over time of the growth rate is greater the smaller the factor $k_{eff}$.

In accordance with the present invention, the foregoing problems are solved by placing the supplementary heater exclusively on that side of the flat coil which faces the monocrystalline rod part.

BRIEF DESCRIPTION OF THE DRAWING

Features of the invention and additional objects of the invention will be more readily appreciated and better understood by reference to the following detailed description which should be considered in conjunction with the drawing.

The invention is explained in greater detail with reference to illustrative embodiments shown in FIGS. 1 through 3.

DETAILED DESCRIPTION

Figure 1:
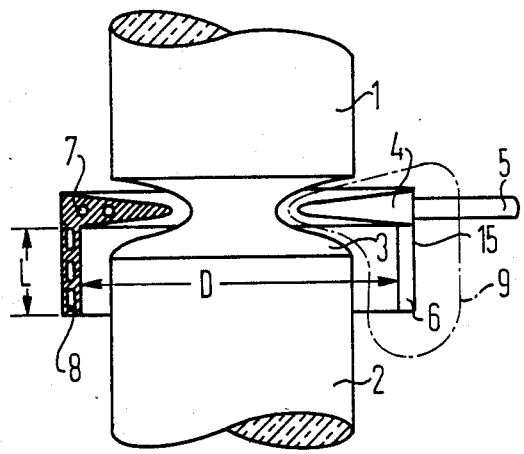
FIG. 1 provides a sectional view of an induction heater in accordance with a first embodiment of the invention with a semiconductor rod to be melted.

The induction heater according to FIG. 1 has a known single turn flat coil 4, which is provided with terminals. Of these one is labeled 5. The flat coil 4 can also have several turns. The flat coil 4 melts a supply rod 1, which is turned into a monocrystalline semiconductor rod 2. Both rod parts are connected with each other by a melt zone 3.

The flat coil 4 is provided on the side facing the monocrystalline rod part 2 coaxially with a cylindrical supplementary heater 6. This material may consist, for example, of the same metal having good electrical conductivity as the flat coil 4. The supplementary heater 6 is connected mechanically with the flat coil 4 and is electrically connected parallel to it. Flat coil 4 and supplementary heater 6 form a common gap 15. The flat coil and the supplementary heater are provided with cooling channels 7, 8.

During zone melting field lines form due to the shape of the flat coil 4 and the supplementary heater 6, which partially run parallel to the axis of the monocrystalline rod part 2. A field line of this nature is here referred to by 9. Through this field distribution the monocrystalline rod part is after-heated, so that the temperature gradient in the growing monocrystal rod 2 becomes smaller. In conjunction with it the homogeneity of the temperature in the melt is improved, so that the connection in the melt and thus at the boundary between the melt and the monocrystalline semiconductor rod 2 is decreased. With that the fluctuations of the growth rate decrease, so that the fluctuations of the factor $k_{eff}$ over time also remain small. Doping fluctuations also become smaller. For example, when doping silicon with indium a decrease of the doping fluctuations by a factor of two or three was achieved compared to a normal flat coil.

Figure 2:
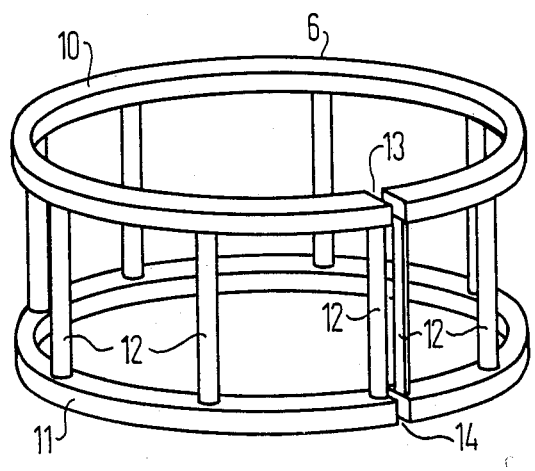
FIG. 2 depicts a further illustrative embodiment of an after-heater.

In order to permit observation of the melt zone during zone melting, it is useful to provide the supplementary heater 6 with openings. The supplementary heater can, however, as shown in Fig. 2, consist of two metal rings 10, 11, which are connected with each other by axial metal rods 12. The ring 10, 11 and the rods 12 consist of a metal, which has good electrical conductivity, such as for example copper or silver. The rings 10, 11 are provided with radial slots 13, 14 in order to avoid short circuiting the supply voltage. These slots are placed in the radial direction aligned one after the other. If the cage formed with rings 10, 11 and the rods 12 is connected with a flat coil according to FIG. 1, the slots 13, 14 are aligned with regard to the slot of the coil. The distance of the rods 12 arranged on both sides of the slots 13, 14 corresponds to the width of the slot. The rods 12 can be shaped planar on the faces opposing each other, so that between the ends of the after-heater a homogeneous slot is located.

Figure 3:
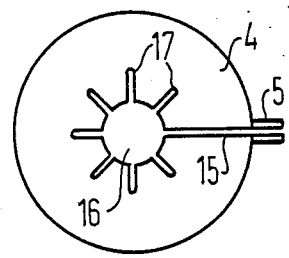
FIG. 3 depicts a view from above of a further development of the flat coil according to FIG. 1.

Further improvement of the temperature homogeneity can be achieved by providing the flat coil (FIG. 3) with slots 17 which extend radially from the opening 16 of the coil 4. These slots cause the asymmetrie due to the slot 15 between the coil ends to become symmetrical. The slots 17 are arranged with the same angular distance with respect to each other and to the slot 15. The above mentioned improvement of the homogeneity was achieved with a silicon rod of 52 mm diameter with an induction heater, in which the inner diameter of the coil was 27 mm, the outer diameter 77 mm, the inner diameter of the after-heater 70 mm and its length 40 mm. With increasing L the duration of after-heating is increased, with decreasing D the temperature of the after-heating.

There has thus been shown and described a novel inductive heater for float zone melting which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. An induction heater for floating zone melting of a crystalline semiconductor rod, the induction heater comprising: a flat coil and a cylindrical supplementary heater arranged coaxially with the flat coil and connected to the coil; the supplementary heater being of an electrically conductive metal and electrically connected parallel with the flat coil; the supplementary heater being arranged exclusively on one side of the flat coil the supplementary heater having two metal rings and axial metal rods extending between the two metal rings to form a cylindrical cage, and each metal ring having a radial slot, the radial slot of one metal ring axially with the radial slot of the other ring, and the flat coil having a single turn defining an opening and two terminals having a slot between them aligned with the radial slots.

2. An induction heater according to claim 1, wherein the flat coil is provided with radial slots extending from its opening, which with respect to each other and with a slot formed between the ends of the flat coil are distributed uniformly around the opening.

3. An induction heater according to claim 1, wherein the supplementary heater includes a plurality of cooling channels.

4. Apparatus for float zone melting of a crystalline semiconductor rod, the apparatus comprising: an induction heater including a planar coil having an aperture for surrounding a float zone of a semiconductor rod while being heated and a cylindrical supplementary heater, the aperture positioned about an axis normal to the planar coil and coextensive with a linear central region of the semiconductor rod, the planar coil having a radial slot oriented in the plane of the aperture, the cylindrical supplementary heater being positioned parallel to the planar coil and symmetrically about the axis, the supplementary heater having a slot in its circumference parallel to the axis positioned to meet with the radial slot of the planar coil to form a common gap in the apparatus, the supplementary heater being connected in parallel to the planar coil, the supplementary heater being located exclusively on one side of the planar coil for surrounding a portion of the semiconductor rod after passing through the aperture so that the supplementary heater is an after heater following the float zone.

* * * * *